(12) United States Patent
Kim

(10) Patent No.: US 9,263,506 B2
(45) Date of Patent: Feb. 16, 2016

(54) ORGANIC LIGHT EMITTING DIODE (OLED) DISPLAY INCLUDING CURVED OLED

(71) Applicant: SAMSUNG DISPLAY CO., LTD., Yongin, Gyeonggi-do (KR)

(72) Inventor: Sang-Woo Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 9 days.

(21) Appl. No.: 14/029,613

(22) Filed: Sep. 17, 2013

(65) Prior Publication Data
US 2014/0312319 A1    Oct. 23, 2014

(30) Foreign Application Priority Data
Apr. 17, 2013  (KR) .................. 10-2013-0042363

(51) Int. Cl.
| H01L 29/08 | (2006.01) |
| H01L 27/32 | (2006.01) |
| H01L 27/12 | (2006.01) |
| H01L 51/00 | (2006.01) |

(52) U.S. Cl.
CPC .......... *H01L 27/326* (2013.01); *H01L 27/1248* (2013.01); *H01L 27/3258* (2013.01); *H01L 27/3262* (2013.01); *H01L 51/0097* (2013.01); *H01L 2251/5338* (2013.01)

(58) Field of Classification Search
CPC ..................... H01L 27/3244; H01L 27/3258
See application file for complete search history.

(56) References Cited

U.S. PATENT DOCUMENTS

| 5,880,797 A * | 3/1999 | Yamada et al. ................. 349/84 |
| 6,621,540 B2 * | 9/2003 | Noritake et al. .............. 349/113 |
| 2003/0201716 A1 * | 10/2003 | Yamazaki et al. ............ 313/506 |
| 2009/0114915 A1 * | 5/2009 | Toriumi ........................... 257/52 |
| 2010/0164973 A1 * | 7/2010 | Huitema et al. .............. 345/581 |
| 2010/0293782 A1 * | 11/2010 | Yamazaki et al. .............. 29/825 |

FOREIGN PATENT DOCUMENTS

| JP | 2009-092998 A | 4/2009 |
| KR | 10-2006-0114086 A | 11/2006 |
| KR | 10-0662622 B1 | 12/2006 |
| KR | 10-2008-0069076 A | 7/2008 |

* cited by examiner

*Primary Examiner* — Jesse Y Miyoshi
(74) *Attorney, Agent, or Firm* — Knobbe, Martens, Olson & Bear, LLP

(57) ABSTRACT

An organic light emitting diode (OLED) display is disclosed. In one aspect, the OLED display includes a flexible substrate and a plurality of OLEDs. The flexibility substrate includes at least one curved portion. The OLEDs are positioned in every pixel area that is set on the flexible substrate and includes a pixel electrode, an organic emission layer, and a common electrode. At least one OLED that is positioned at a curved portion in the OLEDs is formed in a lens shape and concentrates light toward the center of a pixel area.

21 Claims, 7 Drawing Sheets

ORGANIC LIGHT EMITTING DIODE (OLED) DISPLAY INCLUDING CURVED OLED

RELATED APPLICATIONS

This application claims priority to and the benefit of Korean Patent Application No. 10-2013-0042363 filed in the Korean Intellectual Property Office on Apr. 17, 2013, the entire contents of which are incorporated herein by reference.

BACKGROUND

1. Field

The described technology generally relates to an organic light emitting diode (OLED) display and more particularly to a flexible OLED display.

2. Description of the Related Technology

An OLED display includes an OLED and a pixel circuit in every pixel area on a substrate and displays an image using light that is emitted from a plurality of OLEDs. The OLED display is a self light emitting type and thus does not require a backlight, unlike a liquid crystal display (LCD) and can thus reduce a thickness and a weight.

SUMMARY

One inventive aspect is an OLED display having advantages of improving display characteristics by minimizing deterioration of white angle difference (WAD) characteristics of a curved portion in the OLED display including the curved portion.

Another aspect is an OLED display including: i) a flexible substrate including at least one curved portion; and ii) a plurality of OLEDs that are positioned at every pixel area that is set on the flexible substrate and that have a pixel electrode, an organic light emitting layer, and a common electrode. At least one OLED that is positioned at the curved portion of the plurality of OLEDs is formed in a lens shape.

The pixel electrode may be a reflective electrode, and the common electrode may be one of a transflective electrode and a transmissive electrode, and at least one OLED that is positioned at the curved portion may be formed in a convex lens shape toward the flexible substrate.

A passivation layer may be positioned between the flexible substrate and the plurality of OLEDs, and the passivation layer that is positioned on the curved portion may have a recess portion in at least one pixel area.

The recess portion and an OLED that is formed on the recess portion may have a section shape of a circular arc shape. The recess portion and an OLED that is formed on the recess portion may be formed with a first lens portion and a second lens portion having different curvatures.

The pixel electrode may be one of a transflective electrode and a transmissive electrode, the common electrode may be a reflective electrode, and at least one OLED that is positioned at the curved portion may be formed in a concave lens shape toward the flexible substrate.

A passivation layer may be positioned between the flexible substrate and the plurality of OLEDs, and the passivation layer that is positioned at the curved portion may form a convex portion in at least one pixel area.

The convex portion and an OLED that is formed on the convex portion may have a section shape of a circular arc shape. The convex portion and an OLED that is formed on the convex portion may be formed with a third lens portion and a fourth lens portion having different curvatures.

The OLED display may further include a thin film encapsulation layer that covers and seals the plurality of OLEDs. The flexible substrate may include a flat portion and a pair of curved portions that are positioned at both sides of the flat portion.

DETAILED DESCRIPTION

When the OLED display uses a polymer film as a substrate, the OLED display can have flexible characteristics. Such a flexible OLED display may include a curved portion and may be set in various shapes such as a shape in which a flat portion and a curved portion are combined or a shape in which a plurality of curved portions are continuously connected.

However, in the curved portion, luminance and color scattering on a position basis is large, compared with the flat portion and luminance deterioration and color coordinate change according to a viewing angle may more largely occur. That is, in the curved portion, white angle difference (WAD) characteristics may be deteriorated. The WAD is an item that evaluates a change in white characteristics according to a viewing angle, and by measuring a luminance change amount and a color coordinate change amount, compared with a front surface that is vertical to a screen, a level thereof is evaluated.

Embodiments will be described more fully hereinafter with reference to the accompanying drawings. As those skilled in the art would realize, the described embodiments may be modified in various different ways, all without departing from the spirit or scope of the present invention.

In addition, in the specification, unless explicitly described to the contrary, the word "comprise" and variations such as "comprises" or "comprising", will be understood to imply the inclusion of stated elements but not the exclusion of any other elements. When it is said that any part, such as a layer, film, region, or plate, is positioned on another part, it means the part is directly on the other part or above the other part with at least one intermediate part. Further, if any part is said to be positioned directly on another part, it means that there is no intermediate part between the two parts.

Figure 1:
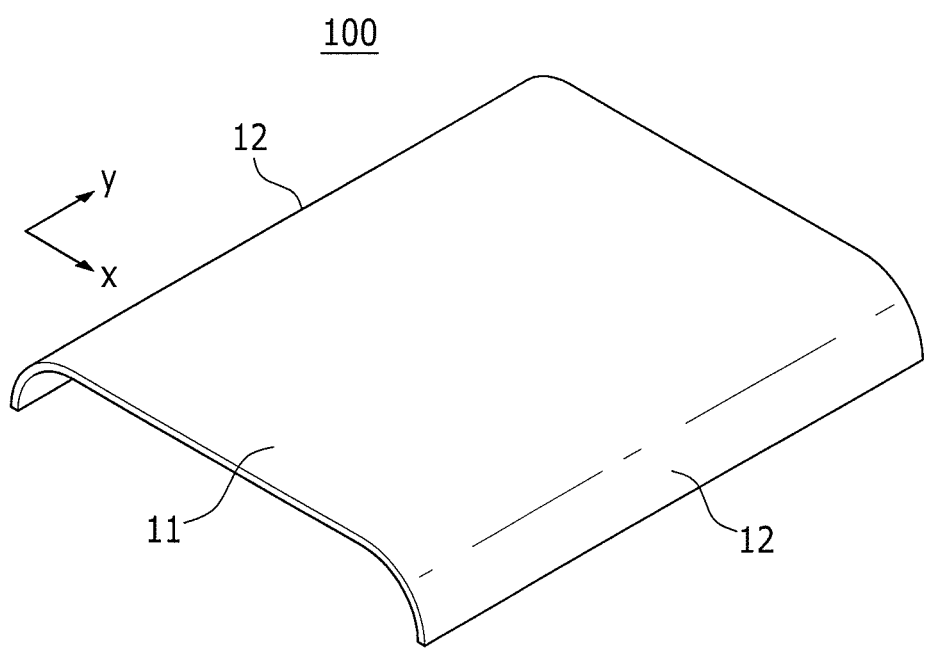
FIG. 1 is a schematic diagram of an OLED display according to a first exemplary embodiment.

FIG. 1 is a schematic diagram of an OLED display according to a first exemplary embodiment.

Referring to FIG. 1, an OLED display 100 is a flexible display device having a flexible substrate and includes at least one curved portion 12. For example, the OLED display 100 may include a flat portion 11 and a pair of curved portions 12 that are positioned at both sides of the flat portion 11.

The curved portions 12 contact with two long sides of the flat portion 11 and may be formed without a curvature change in a long side direction (y-axis direction of FIG. 1) of the flat portion 11. In some embodiments, the curved portions 12 are formed in the same curvature, and the curvature center of two curved portions 12 may be positioned at the same side.

The OLED display 100 is not limited to an example of FIG. 1, and the flat portion 11 may be formed in several shapes of a method in which the curved portion 12 may contact with two short sides of the flat portion 11, contact with the entire edge of the flat portion 11, or be positioned at the center of the flat portion 11.

Further, although not shown in FIG. 1, but at the outside of a display surface (an upper surface of the OLED display of FIG. 1) of the OLED display 100, a cover window is positioned, and a touch screen panel and an optical film for external light reflection are positioned between the OLED display 100 and the cover window. The cover window is formed with a transparent plastic resin and protects the OLED display 100 from an external impact and scratch occurring while using.

Because a display surface is bent in the curved portion 12, unlike the flat portion 11, light that is emitted from a pixel of the curved portion 12 has a large spread angle, compared with the flat portion 11 and thus luminance may deteriorate. Further, in the flat portion 11, a color coordinate change and luminance deterioration according to a viewing angle may more largely occur, compared with the flat portion 11. That is, in the curved portion 12, white angle difference (WAD) characteristics may deteriorate.

In the OLED display 100, by applying a lens structure to be described later to the OLED that is positioned at the curved portion 12, light that is emitted from each pixel is concentrated and thus luminance is enhanced and deterioration of WAD characteristics is minimized.

Figure 2:
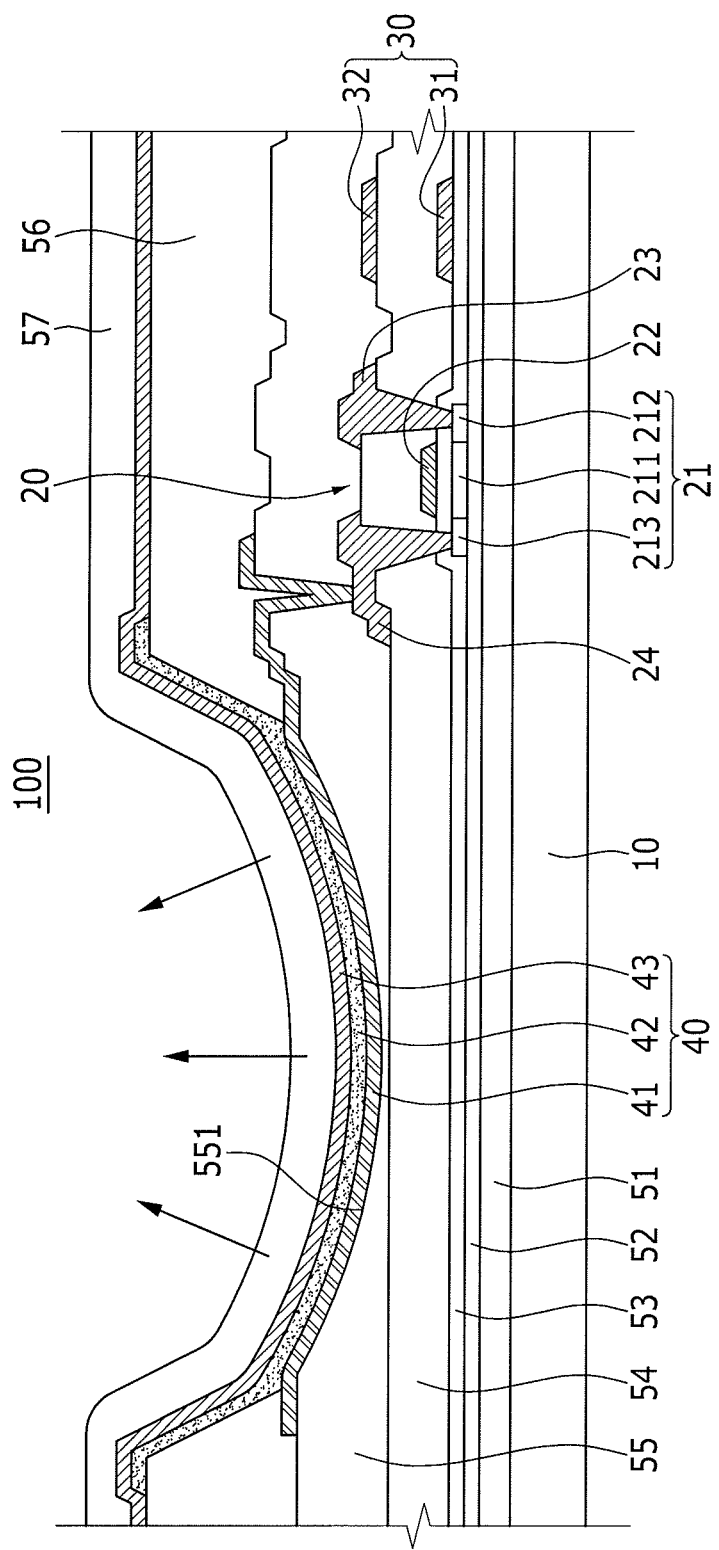
FIG. 2 is an enlarged cross-sectional view of a curved portion of the OLED display of FIG. 1.

FIG. 2 is an enlarged cross-sectional view of a curved portion of the OLED display of FIG. 1.

Referring to FIG. 2, the OLED display 100 includes a flexible substrate 10, a thin film transistor 20 that is formed on the flexible substrate 10, a capacitor 30, and an OLED 40. The flexible substrate 10 may be formed with a transparent or opaque polymer film.

The thin film transistor 20 and the capacitor 30 form a pixel circuit, and the pixel circuit and the OLED 40 are positioned in every pixel area on the flexible substrate 10. The OLED display 100 displays an image by combining light that is emitted from a plurality of OLEDs 40. FIG. 2 illustrates one enlarged pixel area.

A barrier layer 51 and a buffer layer 52 are positioned on the flexible substrate 10. The barrier layer 51 includes a plurality of inorganic films and may be formed in a structure in which, for example, $SiO_2$ layers and SiNx layers are alternately repeatedly stacked. Because the barrier layer 51 has a water vapor transmission rate and an oxygen transmission rate lower than those of the flexible substrate 10, moisture and oxygen, having permeated the flexible substrate 10 are suppressed from permeating to a pixel circuit and the OLED 40.

The buffer layer 52 is formed with an inorganic film and may include, for example, $SiO_2$ or SiNx. The buffer layer 52 provides a flat surface for forming a pixel circuit and suppresses a foreign substance and moisture from permeating to the pixel circuit and the OLED 40.

The thin film transistor 20 and the capacitor 30 are formed on the buffer layer 52. The thin film transistor 20 includes a semiconductor layer 21, a gate electrode 22, and a source/drain electrode 23 and 24. The semiconductor layer 21 is formed with polysilicon or an oxide semiconductor and includes a channel area 211 in which impurities are not doped and a source area 212 and a drain area 213 in which impurities are doped at both sides of the channel area 211. When the semiconductor layer 21 is formed with an oxide semiconductor, a separate protective layer for protecting the oxide semiconductor may be added.

A gate insulating layer 53 is positioned between the semiconductor layer 21 and the gate electrode 22, and an interlayer insulating layer 54 is positioned between the gate electrode 22 and the source/drain electrode 23 and 24.

The capacitor 30 includes a first capacitor plate 31 that is formed on the gate insulating layer 53 and a second capacitor plate 32 that is formed on the interlayer insulating layer 54. The first capacitor plate 31 may be made of the same material as that of the gate electrode 22, and the second capacitor plate 32 may be made of the same material as that of the source/drain electrode 23 and 24. The second capacitor plate 32 is connected to the source electrode 23.

The thin film transistor 20 of FIG. 2 is a driving thin film transistor, and the pixel circuit further includes a switching thin film transistor (not shown). The switching thin film transistor is used as a switch that selects a pixel to emit light, and the driving thin film transistor applies power to enable the selected pixel to emit light to a corresponding pixel.

A passivation layer 55 is positioned on the source/drain electrodes 23 and 24 and the second capacitor plate 32. The passivation layer 55 may be made of an organic insulator or a non-organic insulator or may be made of a composite of an organic insulator and a non-organic insulator. As the organic insulator, an acryl-based resin, an epoxy resin, a phenolic resin, and a polyamide resin may be used. The passivation layer 55 forms a via hole that exposes a portion of the drain electrode 24, and the OLED 40 is formed on the passivation layer 55.

The OLED 40 includes a pixel electrode 41, an organic emission layer 42, and a common electrode 43. The pixel electrode 41 may be individually formed in every pixel and connected to the drain electrode 24 of the thin film transistor 20 through a via hole. The common electrode 43 may be formed in the entire display area of the flexible substrate 10. A pixel defining layer 56 is positioned on the pixel electrode 41. The pixel defining layer 56 forms an opening that exposes the pixel electrode 41, and the organic emission layer 42 is formed in the opening to contact with the pixel electrode 41.

The organic emission layer 42 may be one of a red emission layer, a green emission layer, and a blue emission layer. Alternatively, the organic emission layer 42 may be a white emission layer or may be a stacked layer of a red emission layer, a green emission layer, and a blue emission layer. In a case of the latter, the OLED display 100 may further include a color filter (not shown). The color filter includes a red filter corresponding to a red pixel, a green filter corresponding to a green pixel, and a blue filter corresponding to a blue pixel.

One of the pixel electrode 41 and the common electrode 43 is an anode, which is a hole injection electrode, and the other one thereof is a cathode, which is an electron injection electrode. Holes that are injected from an anode and electrons that are injected from a cathode are coupled in the organic emission layer 42 to generate excitons, and while the exciton emits energy, light is emitted.

At least one layer of a hole injection layer (HIL) and a hole transport layer (HTL) may be positioned between an anode and the organic emission layer 42, and at least one layer of an electron injection layer (EIL) and an electron transport layer (ETL) may be positioned between the organic emission layer 42 and a cathode. An HIL, an HTL, an ETL, and an EIL may be formed in an entire display area of the flexible substrate 10 without division of a pixel.

In some embodiments, the pixel electrode 41 is a reflective electrode, and the common electrode 43 is a transflective electrode or a transmissive electrode. The pixel electrode 41 may be a single layer or a multilayer including one of aluminum (Al), gold (Au), silver (Ag), magnesium (Mg), lithium (Li), and calcium (Ca). The common electrode 43 may include one of indium tin oxide (ITO), indium zinc oxide (IZO), zinc oxide (ZnO), and indium oxide ($In_2O_3$).

In some embodiments, light that is emitted from the organic emission layer 42 is reflected from the pixel electrode 41, transmits the common electrode 43, and is emitted to the outside. Such a light emitting structure is referred to as a front surface light emitting type. When the common electrode 43 is a transflective type, a portion of light is re-reflected from the common electrode 43 to the pixel electrode 41 to form a resonant structure.

A thin film encapsulation layer 57 is positioned on a plurality of OLEDS 40. The thin film encapsulation layer 57 seals the OLED 40 from an external environment including moisture and oxygen to suppress deterioration of the OLED 40 by moisture and oxygen. The thin film encapsulation layer 57 may have a structure in which a plurality of organic films and a plurality of inorganic films are alternately stacked one by one.

In some embodiments, an organic film of the thin film encapsulation layer 57 is formed with a polymer and may be, for example, a single layer or a stacked layer that is formed with one of polyethyleneterephthalate, polyimide, polycarbonate, epoxy, polyethylene, and polyacrylate. An inorganic film of the thin film encapsulation layer 57 may be a single layer or a stacked layer including metal oxide or metal nitride. For example, the inorganic film may include one of SiNx, $Al_2O_3$, $SiO_2$, and $TiO_2$.

The passivation layer 55 that is positioned at the flat portion 11 is formed in a constant thickness, but the passivation layer 55 that is positioned at the curved portion 12 forms a recess portion 551 in every pixel area. That is, in the curved portion 12, the thickness of the passivation layer 55 is a minimum at the center of a pixel area and gradually increases as advancing toward an edge of the pixel area. The recess portion 551 may have a circular arc section shape having a predetermined curvature.

The pixel electrode 41 and the organic emission layer 42 may have a constant thickness on the recess portion 551. The pixel electrode 41 and the organic emission layer 42 may be concavely formed to correspond to the recess portion 551, and in the common electrode 43, a portion corresponding to the pixel electrode 41 may be also concavely formed. In some embodiments, the OLED 40 that is positioned at the curved portion 12 is formed in a concave lens shape toward an outer surface of the thin film encapsulation layer 57 to be a display surface and is formed in a convex lens shape toward the flexible substrate 10.

Therefore, when light is emitted from the organic emission layer 42 is reflected from the pixel electrode 41, reflection light is concentrated by the concavely formed pixel electrode 41. That is, when light of the organic emission layer 42 is reflected by the pixel electrode 41, spread of reflected light toward an adjacent pixel decreases, and reflected light is concentrated toward the center of a pixel area.

As the passivation layer 55 is formed in a constant thickness, when it is assumed that the OLED 40 is flatly formed, reflected light of the pixel electrode 41 radially spreads. A portion of reflected light having a large spread angle is mixed with light that is emitted from an adjacent pixel to do not contribute to improving luminance of a corresponding pixel. Spread of reflected light and luminance deterioration according to spread of reflected light increase proportional to a curvature of the curved portion 12.

In the OLED display 100, as the OLED 40 is formed in a concave lens shape toward a display surface, light that is emitted from each OLED display 40 is concentrated toward the center of a pixel area. Therefore, luminance of each of pixels that are positioned at the curved portion 12 can be enhanced, and by minimizing a luminance change and a color coordinate change according to a viewing angle, display characteristics of the curved portion 12 can be enhanced.

Figure 3:
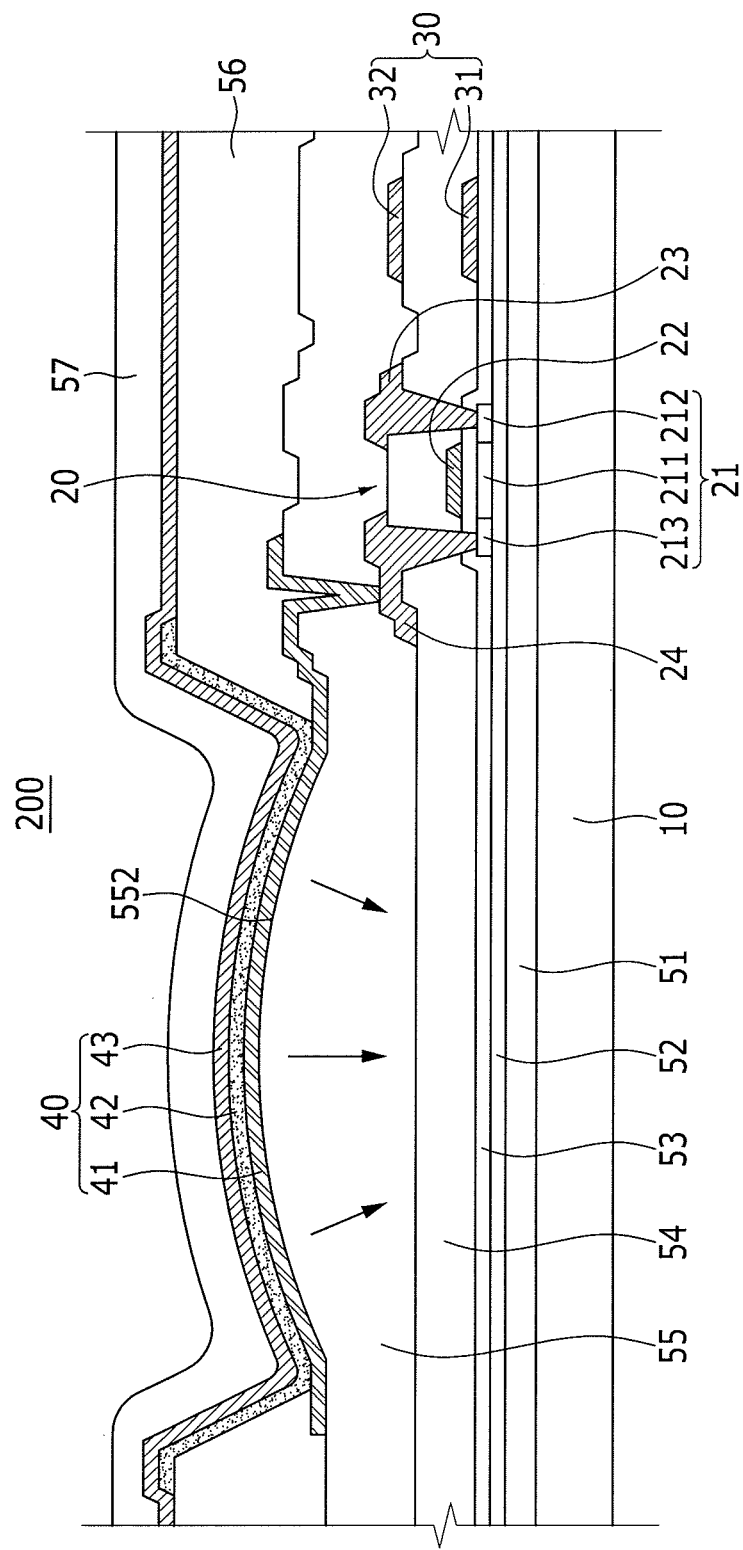
FIG. 3 is an enlarged cross-sectional view of a curved portion of an OLED display according to a second exemplary embodiment.

FIG. 3 is an enlarged cross-sectional view of a curved portion of an OLED display according to a second exemplary embodiment.

Referring to FIG. 3, an OLED display 200 has the same structure as that of the first exemplary embodiment, except that the OLED 40 is a rear surface light emitting type and is formed in a concave lens shape toward the flexible substrate 10. In the second exemplary embodiment, constituent elements identical to or corresponding to those of the first exemplary embodiment are denoted by the same reference numerals and only dissimilar constituent elements will be described hereinafter.

The pixel electrode 41 is a transflective or transmissive electrode, and the common electrode 43 is a reflective electrode. The pixel electrode 41 may include one of indium tin oxide (ITO), indium zinc oxide (IZO), zinc oxide (ZnO), and indium oxide ($In_2O_3$). The common electrode 43 may be a single layer or a multilayer including one of aluminum (Al), gold (Au), silver (Ag), magnesium (Mg), lithium (Li), and calcium (Ca).

Light that is emitted from the organic emission layer 42 is reflected from the common electrode 43, transmits the pixel electrode 41 and the flexible substrate 10, and is emitted to the outside. When the pixel electrode 41 is a transflective type, a portion of light is re-reflected from the pixel electrode 41 to the common electrode 43 to form a resonant structure. In such a rear surface light emitting structure, a display surface becomes an outer surface of the flexible substrate 10, and a touch screen panel and a cover window that are not shown are positioned at an outer surface of the flexible substrate 10.

In some embodiments, the passivation layer 55 that is positioned at the flat portion 11 is formed in a constant thickness, but the passivation layer 55 that is positioned at the curved portion 12 forms a convex portion 552 in every pixel area. In these embodiments, in the curved portion 12, the thickness of the passivation layer 55 is largest at the center of a pixel area and gradually reduces as advancing toward the edge of a pixel area. The convex portion 552 may have a section shape of a circular arc shape having a predetermined curvature.

The pixel electrode 41 and the organic emission layer 42 may have a constant thickness on the convex portion 552. Thereby, the pixel electrode 41 and the organic emission layer 42 are convexly formed to correspond to the convex portion 552, and a portion corresponding to the pixel electrode 41 of the common electrode 43 is also convexly formed. The OLED 40 that is positioned at the curved portion 12 may be formed in a concave lens shape toward an outer surface of the flexible substrate 10 to be a display surface.

Therefore, when light that is emitted from the organic emission layer 42 is reflected by the common electrode 43, reflected light is concentrated by the concave common electrode 43 toward a display surface. Therefore, the OLED display 200 of a second exemplary embodiment can increase luminance of each of pixels that are positioned at the curved portion 12, as in a first exemplary embodiment and minimizes a luminance change and a color coordinate change according to a viewing angle, thereby enhancing display characteristics of the curved portion 12.

In the first exemplary embodiment and the second exemplary embodiment, the OLED 40 is formed in a bilateral symmetrical lens structure. In this case, by forming a single focus, light is concentrated in one direction. The OLED 40 that is positioned at the curved portion 12 may be formed in an asymmetrical lens structure, as needed.

Figure 4:
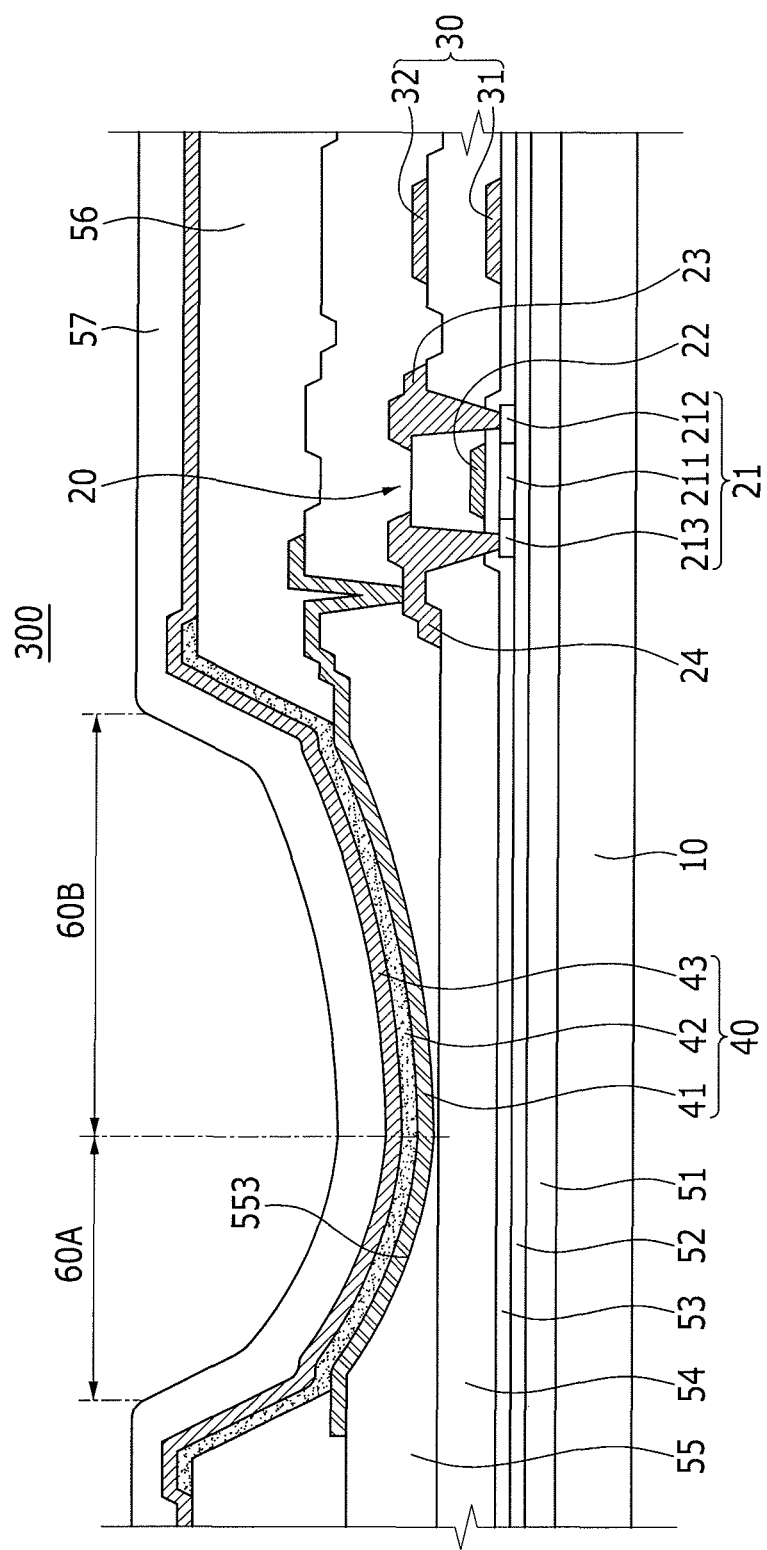
FIG. 4 is an enlarged cross-sectional view of a curved portion of an OLED display according to a third exemplary embodiment.

FIG. 4 is an enlarged cross-sectional view of a curved portion of an OLED display according to a third exemplary embodiment.

Referring to FIG. 4, an OLED display 300 of the third exemplary embodiment has the same structure as that of the first exemplary embodiment, except that the recess portion 553 of the passivation layer 55 and the OLED 40 are formed in a lateral asymmetrical structure. In the third exemplary embodiment, constituent elements identical to or corresponding to those of the first exemplary embodiment are denoted by the same reference numerals.

The recess portion 553 and the OLED 40 that is formed thereon are formed with a first lens portion 60A and a second lens portion 60B having different curvatures. In some embodiments, the first lens portion 60A and the second lens portion 60B have different light concentration directions due to a curvature difference and have also different light quantities due to an area difference. A curvature and a position of the first lens portion 60A and the second lens portion 60B may be adjusted according to a position in which the curved portion 12 occupies in the OLED display 300 and a curvature of the curved portion 12.

Figure 5:
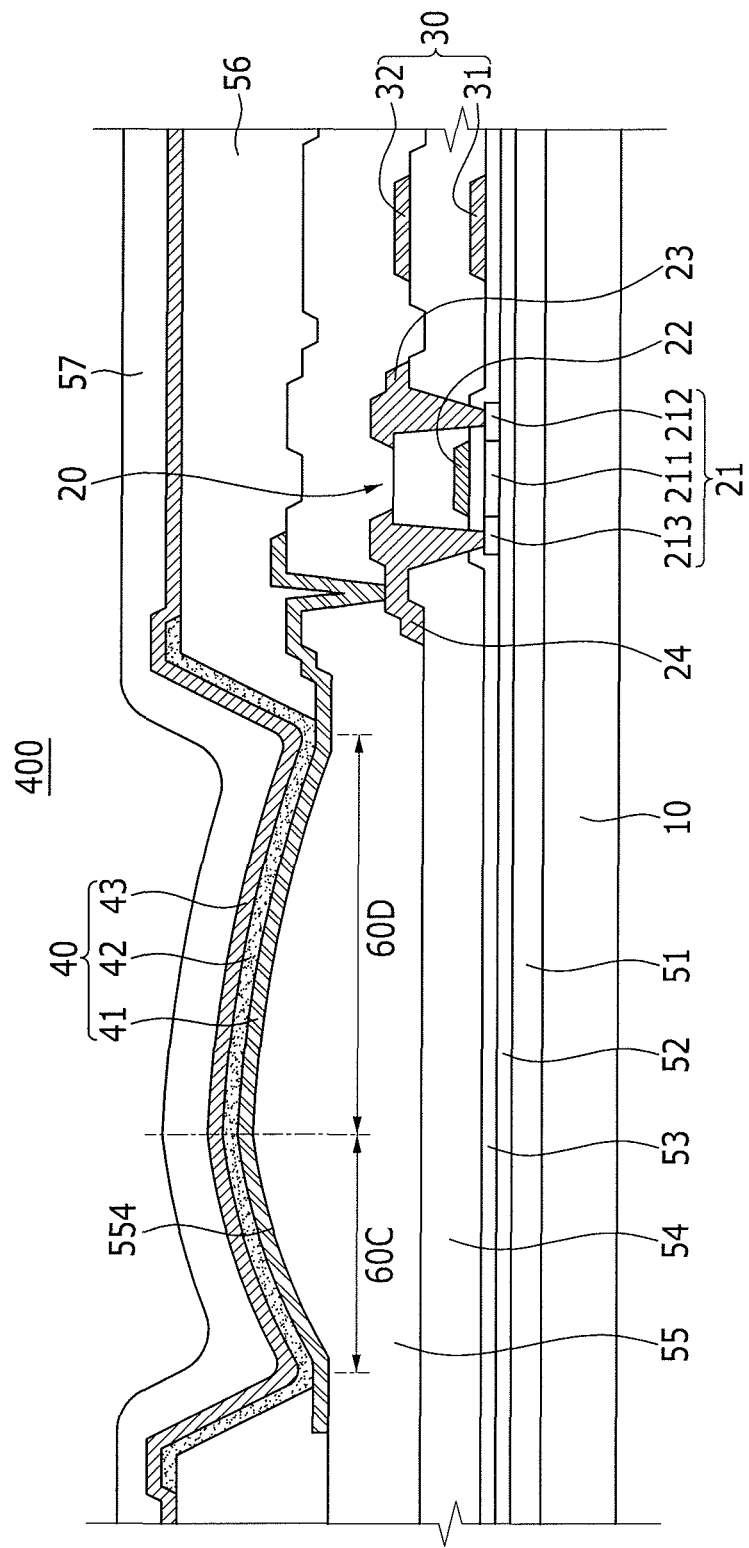
FIG. 5 is an enlarged cross-sectional view of a curved portion of an OLED display according a fourth exemplary embodiment.

FIG. 5 is an enlarged cross-sectional view of a curved portion of an OLED display according a fourth exemplary embodiment.

Referring to FIG. 5, an OLED display 400 of the fourth exemplary embodiment is formed in the same structure as that of the second exemplary embodiment, except that a convex portion 554 of the passivation layer 55 and the OLED 40 are formed in a lateral asymmetrical structure. In the fourth exemplary embodiment, constituent elements identical to or corresponding to those of the second exemplary embodiment are denoted by the same reference numerals.

The convex portion 554 and the OLED 40 that is formed thereon are formed with a third lens portion 60C and a fourth lens portion 60D having different curvatures. The third lens portion 60C and the fourth lens portion 60D have different light concentration directions due to a curvature difference and have different light quantities due to an area difference. A curvature and a position of the third lens portion 60C and the fourth lens portion 60D may be adjusted according to a position at which the curved portion 12 occupies in the OLED display 400 and a curvature of the curved portion 12.

Figure 6:
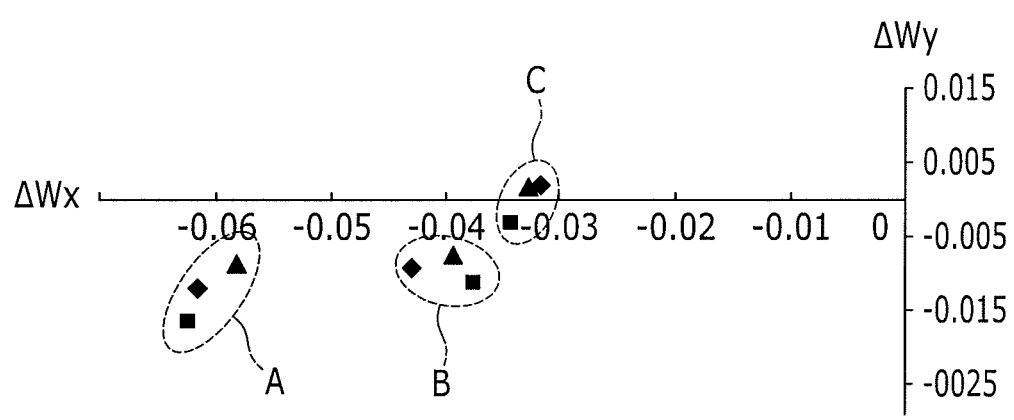
FIG. 6 is a graph illustrating a color coordinate change of a curved portion that is measured in an OLED display of a first exemplary embodiment and an OLED display of Comparative Example.
Figure 7:
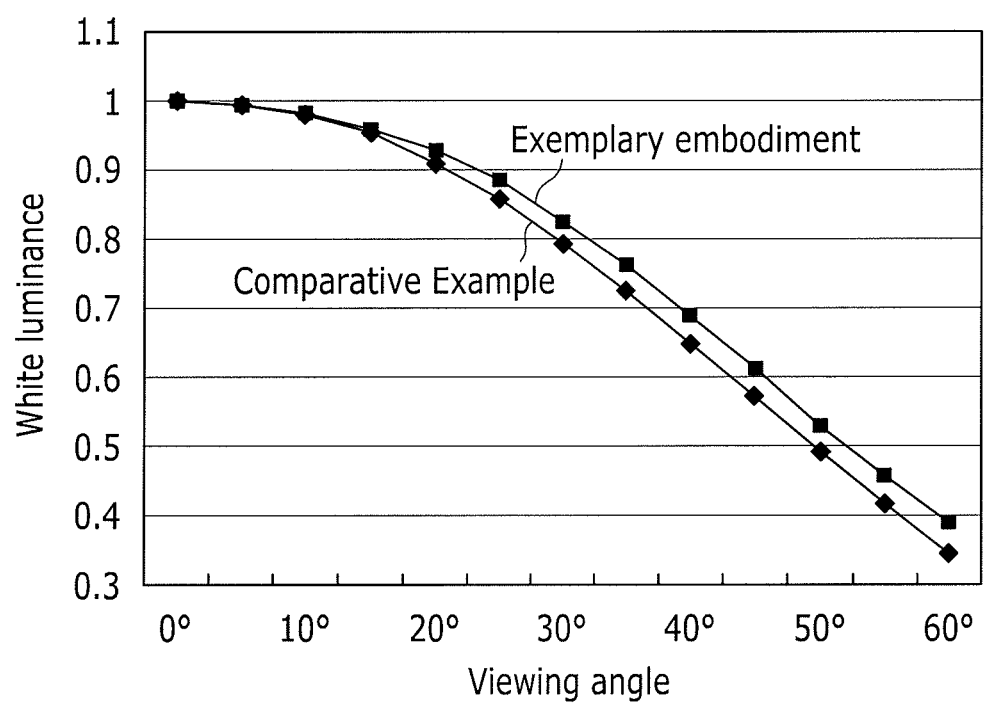
FIG. 7 is a graph illustrating white luminance of a curved portion that is measured in an OLED display of a first exemplary embodiment and an OLED display of Comparative Example.

FIGS. 6 and 7 are graphs illustrating a color coordinate change and white luminance of a curved portion that is measured in an OLED display of a first exemplary embodiment and an OLED of Comparative Example. The OLED of Comparative Example has the same structure as that of the OLED display of the first exemplary embodiment, except that an OLED display that is positioned at a curved portion is formed parallel (flat) to a flexible substrate.

In FIG. 6, a horizontal axis of a graph represents a change amount ΔWx of an x-axis color coordinate, and a vertical axis represents a change amount ΔWy of an y-axis color coordinate. In FIG. 7, a group that is represented by A is a measurement result of Comparative Example, a group that is represented by B is a simulation result of a first exemplary embodiment, and a group that is represented by C is a measurement result of a first exemplary embodiment.

Referring to FIG. 6, in Comparative Example, an x-axis color coordinate change amount exceeds maximum −0.06, and an y-axis color coordinate change amount exceeds maximum −0.015. However, in the first exemplary embodiment, both a simulation result and an actual measurement value represent a color coordinate change smaller than that of Comparative Example, and particularly, an actual measurement result represents a smaller color coordinate change amount than a simulation result. Referring to FIG. 7, the first exemplary embodiment represents high white luminance in an entire viewing angle range than Comparative Example.

In this way, in the OLED display of the first exemplary embodiment, it may be determined that both a color coordinate change and a luminance change of a curved portion decrease, compared with Comparative Example, and thus display characteristics of the curved portion can be enhanced.

According to at least one of the disclosed embodiments, because an OLED that is positioned at a curved portion is formed in a concave lens shape toward a display surface, light that is emitted from each OLED is concentrated toward the center of a pixel area. Therefore, luminance of each of pixels that are positioned at a curved portion can be enhanced, and by minimizing a luminance change and a color coordinate change according to a viewing angle, display characteristics of the curved portion can be enhanced.

While the above embodiments have been described in connection with the accompanying drawings, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
   a flexible substrate comprising at least one curved portion and a non-curved portion, wherein the flexible substrate comprises a plurality of pixel regions; and
   a plurality of OLEDs positioned in each of the pixel regions, wherein each of the OLEDs comprises a pixel electrode, an organic light emitting layer, and a common electrode,
   wherein at least one of the OLEDs is positioned at the curved portion and has a lens shape, wherein the at least one OLED having the lens shape is formed only in the curved portion of the flexible substrate, and wherein no OLED having a lens shape is formed in the non-curved portion of the flexible substrate.

2. The OLED display of claim 1, wherein the pixel electrode is a reflective electrode, wherein the common electrode is one of a transflective electrode and a transmissive electrode, and wherein the at least one OLED is convex toward the flexible substrate.

3. The OLED display of claim 2, further comprising a passivation layer positioned between the flexible substrate and the OLEDs, wherein at least part of the passivation layer is positioned on the curved portion and has a recess portion in at least one pixel region.

4. The OLED display of claim 3, wherein each of cross-sections of i) the recess portion and ii) an OLED that is formed on the recess portion has a circular arc shape.

5. The OLED display of claim 3, wherein the recess portion and an OLED that is formed on the recess portion comprise a first lens portion and a second lens portion having different curvatures.

6. The OLED display of claim 1, wherein the pixel electrode is one of a transflective electrode and a transmissive electrode, wherein the common electrode is a reflective electrode, and wherein the at least one OLED is concave curved away from the flexible substrate.

7. The OLED display of claim 6, further comprising a passivation layer positioned between the flexible substrate and the OLEDs, wherein at least part of the passivation layer is positioned at the curved portion and has a convex portion in at least one pixel region.

8. The OLED display of claim 7, wherein each of cross-sections of i) the convex portion and ii) an OLED that is formed on the convex portion has a circular arc shape.

9. The OLED display of claim 7, wherein the convex portion and an OLED that is formed on the convex portion comprise a third lens portion and a fourth lens portion having different curvatures.

10. The OLED display of claim 1, further comprising a thin film encapsulation layer covering and sealing the OLEDs.

11. The OLED display of claim 10, wherein the flexible substrate comprises a flat portion and a pair of curved portions that are positioned at both sides of the flat portion.

12. The OLED display of claim 1, wherein the at least one OLED includes side portions and a center portion interposed by the side portions, and wherein the center portion is curved.

13. The OLED display of claim 1, wherein the at least one OLED includes side portions and a center portion interposed by the side portions, and wherein the center portion and side portions are curved to have the same curvature.

14. An organic light emitting diode (OLED) display, comprising:
a flexible substrate comprising at least one curved portion and a non-curved portion; and
a plurality of OLEDs respectively formed in a plurality of pixels, wherein the OLEDs comprise at least one OLED positioned at the curved portion and having a lens shape, wherein the at least one OLED having the lens shape is formed only in the curved portion of the flexible substrate, and wherein no OLED having a lens shape is formed in the non-curved portion of the flexible substrate.

15. The OLED display of claim 14, wherein the at least one OLED is curved toward the flexible substrate.

16. The OLED display of claim 14, wherein the at least one OLED is curved away from the flexible substrate.

17. An organic light emitting diode (OLED) display, comprising:
a flexible substrate comprising at least one curved portion and a non-curved portion; and
a plurality of OLEDs respectively formed in a plurality of pixels, wherein the OLEDs comprise at least one OLED positioned at the curved portion and having a lens shape, wherein the at least one OLED having the lens shape is formed only in the curved portion of the flexible substrate, and wherein no OLED having a lens shape is formed in the non-curved portion of the flexible substrate.

18. The OLED display of claim 17, wherein the at least one OLED is convex toward the flexible substrate.

19. The OLED display of claim 17, further comprising an encapsulation layer covering the OLEDs, wherein the at least one OLED is convex toward the encapsulation layer.

20. The OLED display of claim 17, further comprising a passivation layer positioned between the flexible substrate and the OLEDs, wherein the passivation layer comprises a recess portion positioned on the curved portion in at least one pixel region.

21. The OLED display of claim 17, further comprising a passivation layer positioned between the flexible substrate and the OLEDs, wherein the passivation layer comprises a convex portion positioned at the curved portion in at least one of the pixel regions.

* * * * *